(12) United States Patent
Hall et al.

(10) Patent No.: US 11,277,903 B2
(45) Date of Patent: Mar. 15, 2022

(54) PATTERN-EDGED METAL-PLANE RESONANCE-SUPPRESSION

(71) Applicant: Intel Corporation, Santa Clara, CA (US)

(72) Inventors: Stephen Harvey Hall, Forest Grove, OR (US); Khang Choong Yong, Puchong (MY); Ying Ern Ho, Bayan Lepas (MY); Yun Rou Lim, Bayan Lepas (MY); Wil Choon Song, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/368,221

(22) Filed: Mar. 28, 2019

(65) Prior Publication Data

US 2020/0314999 A1    Oct. 1, 2020

(51) Int. Cl.
| | | |
|---|---|---|
| *H05K 3/02* | (2006.01) | |
| *H05K 1/02* | (2006.01) | |
| *G05B 19/4097* | (2006.01) | |
| *H05K 1/18* | (2006.01) | |

(52) U.S. Cl.
CPC ....... *H05K 1/0225* (2013.01); *G05B 19/4097* (2013.01); *H05K 3/027* (2013.01); *G05B 2219/45026* (2013.01); *G05B 2219/45034* (2013.01); *H05K 1/18* (2013.01); *H05K 2201/093* (2013.01); *H05K 2201/098* (2013.01); *H05K 2201/09027* (2013.01); *H05K 2201/10098* (2013.01)

(58) Field of Classification Search
CPC ........ H05K 1/0225; H05K 3/027; H05K 1/18; H05K 2201/093; H05K 2201/10098; H05K 2201/098; H05K 2201/09027; G05B 19/4097; G05B 2219/45034; G05B 2219/45026; Y10T 29/49155; H01Q 21/08
USPC .................................................... 29/846, 847
See application file for complete search history.

(56) References Cited

U.S. PATENT DOCUMENTS

| | | | | |
|---|---|---|---|---|
| 6,150,895 | A * | 11/2000 | Steigerwald | H01P 5/02 333/12 |
| 6,665,927 | B1 * | 12/2003 | Dow | H05K 1/0216 29/825 |
| 7,629,930 | B2 * | 12/2009 | Murch | H01Q 1/48 343/700 MS |
| 8,537,065 | B2 * | 9/2013 | Minard | H01Q 1/521 343/770 |

(Continued)

FOREIGN PATENT DOCUMENTS

DE    102020104028 A1    10/2020

*Primary Examiner* — Donghai D Nguyen
(74) *Attorney, Agent, or Firm* — Schwegman Lundberg & Woessner, P.A.

(57) ABSTRACT

Apparatuses and methods are provided for mitigating radio frequency interference and electromagnetic compatibility issues caused by the resonance of metal planes of a circuit board. A method for controlling impedance at an edge of a circuit board includes creating a cut at an edge of a plane of the circuit board. The cut extends from the edge of the plane to a point at a depth into the plane. The method can further include creating a cut pattern in the edge of the plane by repeating the cut along the edge of the plane such that an impedance of the plane at the depth is different, or lower, than an impedance of the plane at the edge of the plane. Other aspects are described.

7 Claims, 6 Drawing Sheets

(56) References Cited

U.S. PATENT DOCUMENTS 8,847,836 B2\* 9/2014 Yu .......................... H01Q 21/08
343/770

\* cited by examiner

PATTERN-EDGED METAL-PLANE RESONANCE-SUPPRESSION

TECHNICAL FIELD

The disclosure herein relates generally to methods for controlling impedance and more particularly to methods for controlling impedance of a circuit board.

BACKGROUND

Circuit boards are widely used in the electronics and computer industries to mechanically and electrically couple individual components. A circuit board is composed of layers of dielectric substrate having signal traces and power planes disposed between the layers of dielectric substrate. A ground plane within the circuit board can be used to provide a reference potential. When an electronic circuit on a circuit board is operated, resonances can occur in the power/ground planes that can interfere with nearby systems such as antennas. Such resonance may also seriously degrade the performance of the circuit board. Methods for reducing this resonance can be costly or can take up a significant amount of valuable real estate on the circuit board, making miniaturization difficult.

BRIEF DESCRIPTION OF DRAWINGS

In the drawings, which are not necessarily drawn to scale, like numerals may describe similar components in different views. Like numerals having different letter suffixes may represent different instances of similar components. Some aspects are illustrated by way of example, and not limitation, in the figures of the accompanying drawings in which.

DETAILED DESCRIPTION

The following description and the drawings sufficiently illustrate specific aspects to enable those skilled in the art to practice them. Other aspects may incorporate structural, logical, electrical, process, and other changes. Portions and features of some aspects may be included in, or substituted for, those of other aspects. Aspects set forth in the claims encompass all available equivalents of those claims.

Figure 1:
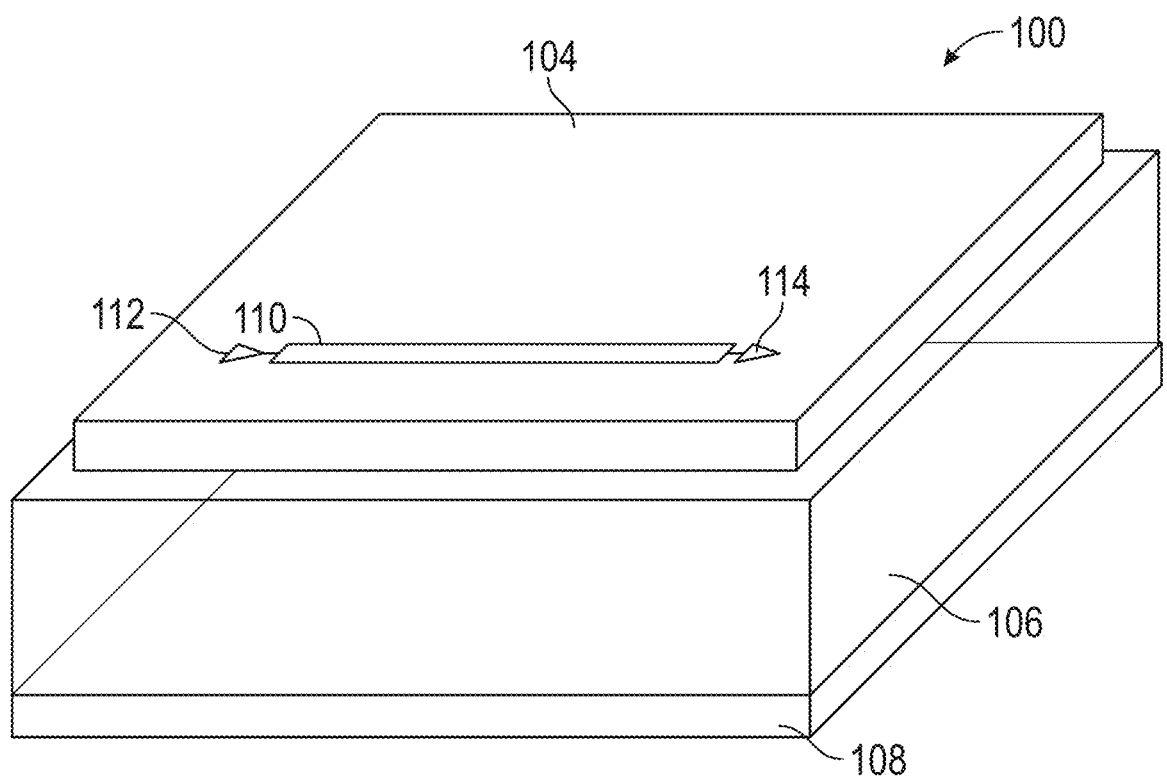
FIG. 1 illustrates generally a portion of printed circuit board including a power plane and ground plane in accordance with some aspects.

FIG. 1 illustrates generally an apparatus or portion of a circuit board 100. Generally, a circuit board comprises one or more layers 104 on which electrical signals may be routed, separated by dielectric layer's 106. The layers 104 for routing can be electrically isolating with conductive traces disposed thereon, or the entire layer 104 may be electrically conductive. Conductive layers may be used to efficiently provide access to a particular voltage level, or voltage plane, over the entire area of the circuit board. Circuit boards with one or more power planes provided by the voltage plane, at same or different voltages, and one or more ground planes 108 are relatively common. The circuit board 100 can include signal routing such as a signal conductor 110 or a signal trace. The circuit board 100 can include a drive circuit 112 and a receiver circuit 114 with the signal conductor 110 coupling the drive circuit 112 to the receiver circuit 114.

When an electronic circuit on a circuit board is operated (e.g., when a signal is provided over signal conductor 110), the variations in voltages between layers cause emission of unwanted electromagnetic waves. For example, resonance of metal power/ground/floating planes in small form factor design (in which antennas are placed closer to systems on a chip (SOC)) can cause radio frequency (RF) interference, electromagnetic compatibility (EMC) issues, and signal integrity (SI) issues. The integration of 5G antennas in future design means that more frequency ranges must be accounted for to avoid RF interference. Some noise reduction methods, such as capacitor-based decoupling methods, dual referencing schemes, etc. may no longer be practical for broad band decoupling because of high costs and because of the limits these methods place on product miniaturization.

The circuit board 100 shown in FIG. 1, taken an as assembly has an overall impedance. Impedance discontinuities occur at the edge of the circuit board 100 because of the boundary between the metal planes of the circuit board 100 (e.g., at the boundary of a low-resistance metal plane (e.g., 2 Ω-plane) and higher-resistance air (e.g., 377 Ω-air). The resonance and resulting RF interference can be exacerbated by the presence of these abrupt impedance changes. Methods and apparatuses according to some aspects can control the impedance transition at the interface and reduce the abruptness of this drop and resulting resonance by trimming, cutting or otherwise modifying an edge region of one or more of the layers of the circuit board 100. In methods according to some aspects, a pattern of shapes (for example, triangular shapes) is created at a region (e.g., an edge) of the one or more layers where there would otherwise be an abrupt impedance change. The abrupt impedance change will be replaced by a gradual impedance change (due to non-parallel edges to the wave-front) that helps to disperse the intensity of the reflected EM at the impedance discontinuities.

Figure 2A:
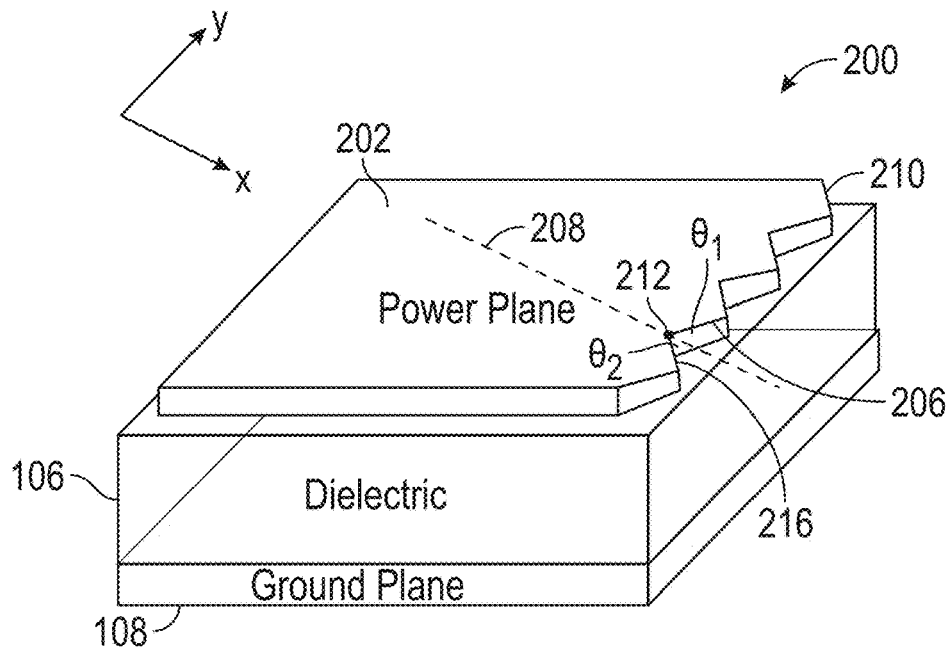
FIG. 2A illustrates a printed circuit board that has been cut or edged using methods according to some aspects.
Figure 2B:
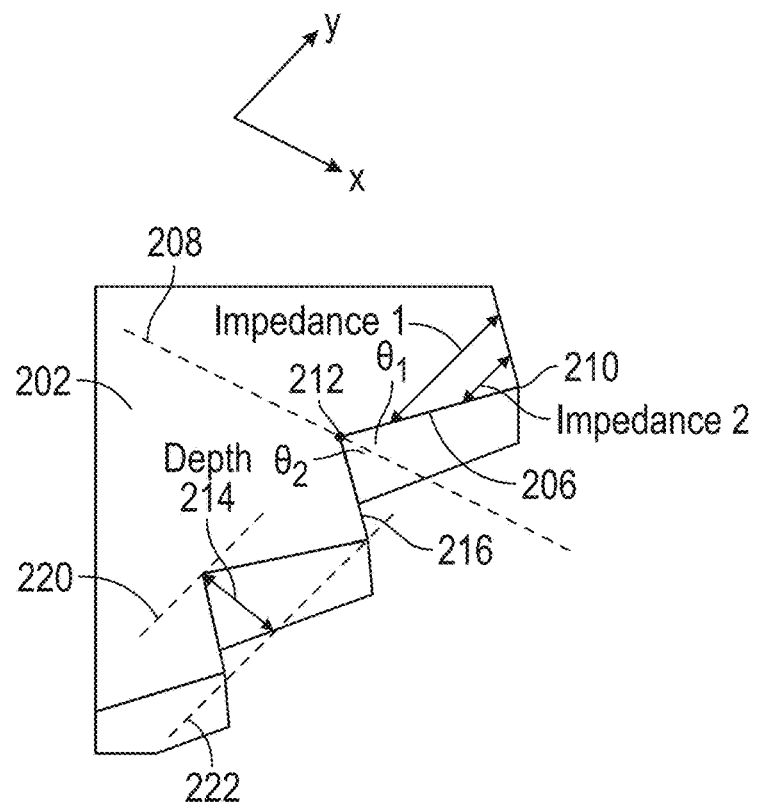
FIG. 2B is a detailed view of cuts that have been provided using methods according to some aspects.

FIG. 2A illustrates a circuit board 200 that has been cut or edged using methods according to some aspects. Cutting may be done using, for example, photolithography, although methods according to aspects are not limited thereto. FIG. 2B is a detailed view of cuts that have been provided using methods according to some aspects. As shown in FIGS. 2A and 2B, cuts can be made in one or more edges of a plane 202 of the circuit board 200. The cutting can be done by orienting a cut 206 at an angle Θ1 relative to an x-axis 208 of the plane 202. The cut 206 can extend from the edge 210 of the plane to a point 212 at depth 214 into the plane, e.g., to a depth 220 along a plane parallel to the y-axis 218. In some aspects, the cutting proceeds by orienting a second cut 216 at an angle Θ2 relative to the x-axis and extending to the point 212. A cut pattern is created in the edge 210 of the plane 202 (parallel to the y-axis 218) by repeating the cut/s along the edge of the plane (e.g., in the y-direction).

A circuit board that has been cut at least somewhat similarly to the depictions of FIGS. 2A and 2B will have different impedance levels at different distances from the edge of the plane. For example, an impedance at depth 220 closer to a center of the plane will be different (e.g., lower) than the impedance at depth 222 (e.g., further toward the outside edge of the plane). Accordingly, the drop off in impedance will proceed smoothly, rather than abruptly, from depth 220 to depth 222. The intensity of the resonance produced by the circuit board is thereby reduced, resulting in alleviation of the above-described EMC/Radio Frequency Interference (RFI) risk. By reducing the resonance intensity, the power-plane to transmission line coupling is also reduced, alleviating SI risks.

The plane 202 can be a power plane. Other planes can be cut, e.g., a ground plane 204 can be cut (not shown in FIG. 2A). More than one layer can be cut. The impedance drop off can be made even more gradual by providing deeper cuts; however, deeper cuts could result in reduced available board area upon which to include circuitry. Accordingly, a tradeoff would exist between reduced resonance and miniaturization. While symmetrical cuts are shown, cuts can be arranged at different angles relative to the x-axis 208 to generate, for example, isosceles triangles, or other shapes.

Triangular-shaped cuts are shown in FIGS. 2A and 2B because such shapes have been shown to most effectively disperse reflections. However, other shapes having non-parallel edges can be used. For example, semi-circular shapes and ellipsoid shapes can also be used. In aspects, the depth 214 can be about 0.4-0.8 millimeters. Depth 214 will be optimized according to design and frequency of interest, e.g., frequencies of resonance that may be expected. In some examples, different cuts can extend different depths 214.

Figure 3:
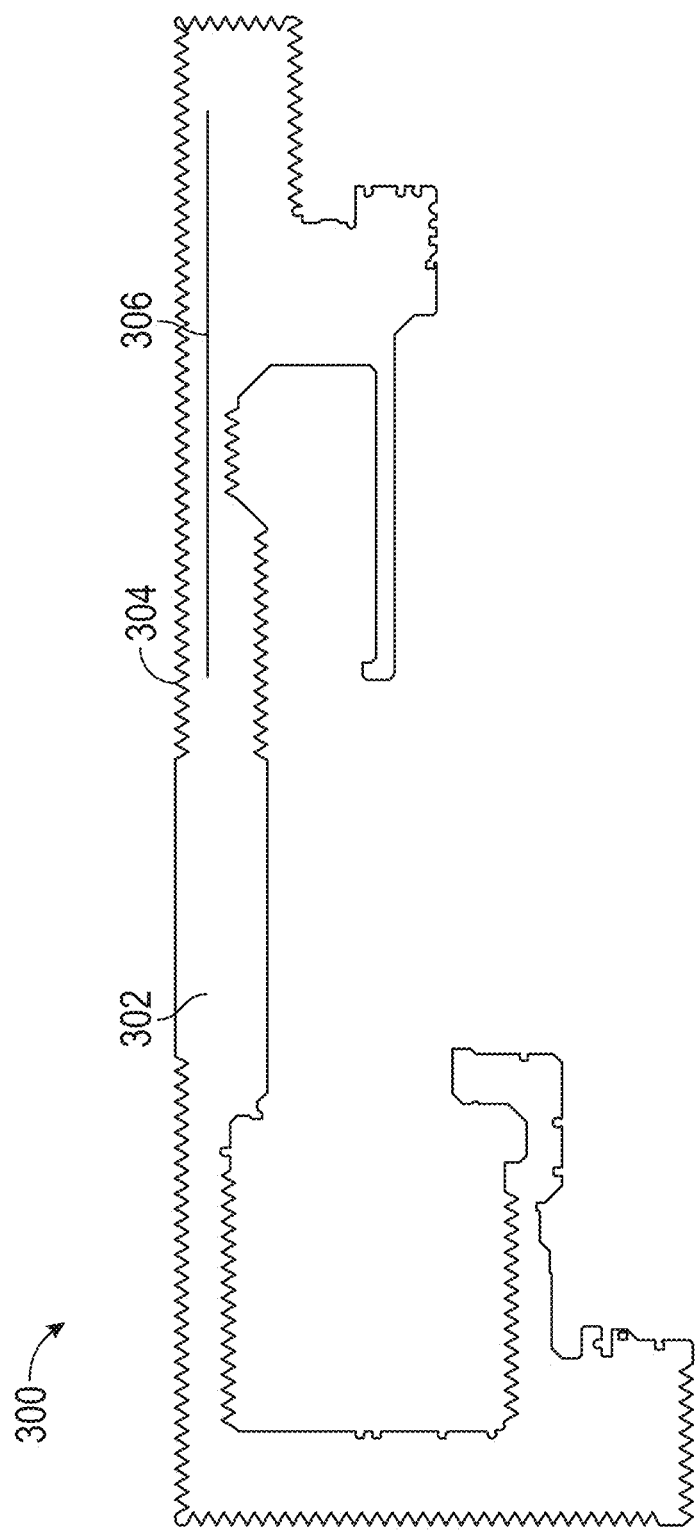
FIG. 3 illustrates a partial top view of a circuit board that has been cut according to aspects.

FIG. 3 illustrates a partial top view of a circuit board 300 that has been cut according to aspects. The edge of power plane 302 has been cut into a cut pattern that includes triangular shapes 304. In operation, the signal trace 306 can be excited using a signal. The signal can create resonances in the circuit board 300 at a resonance frequency (e.g., 3.6 GHz). By cutting the power plane 302 similarly to that depicted in FIG. 3, the intensity of EM waves at the circuit board 300 edges can be reduced, thus reducing interference and SI effects on surround components such as antennas.

Figure 4:
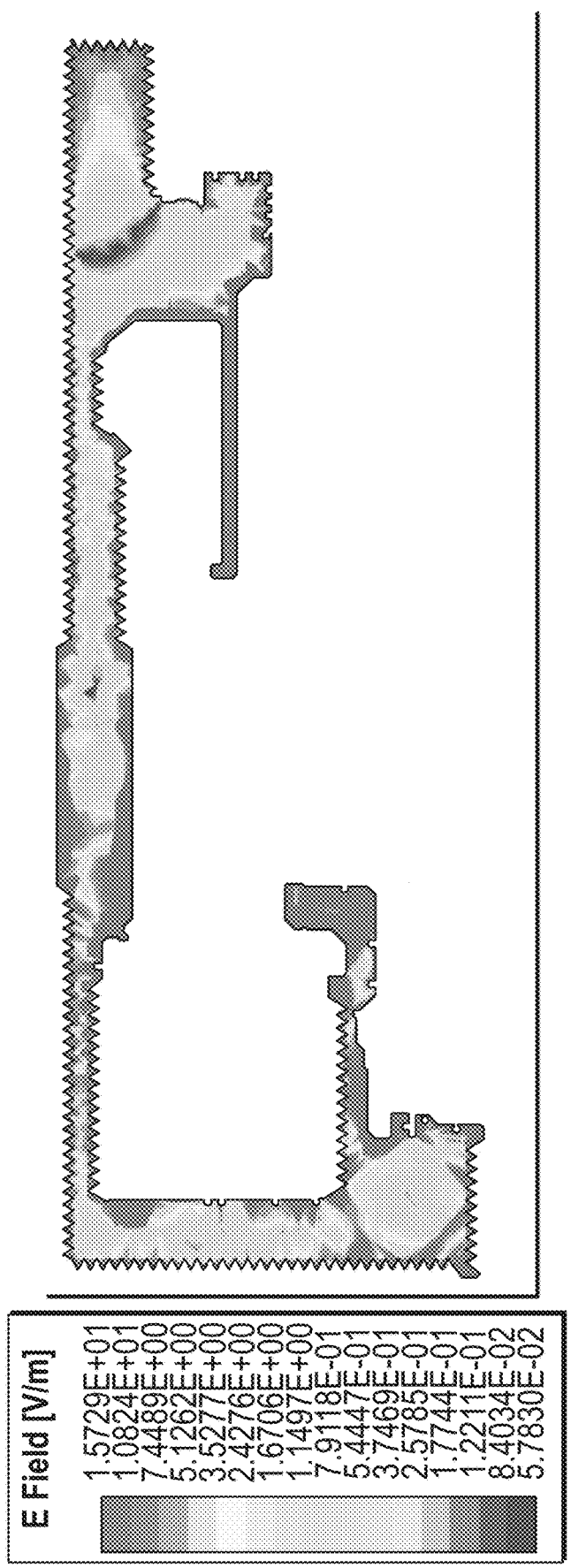
FIG. 4 depicts E-field intensity at a resonance frequency for a power plane that has been cut into triangular patterns at a depth of 8 millimeters according to some aspects.
Figure 5:
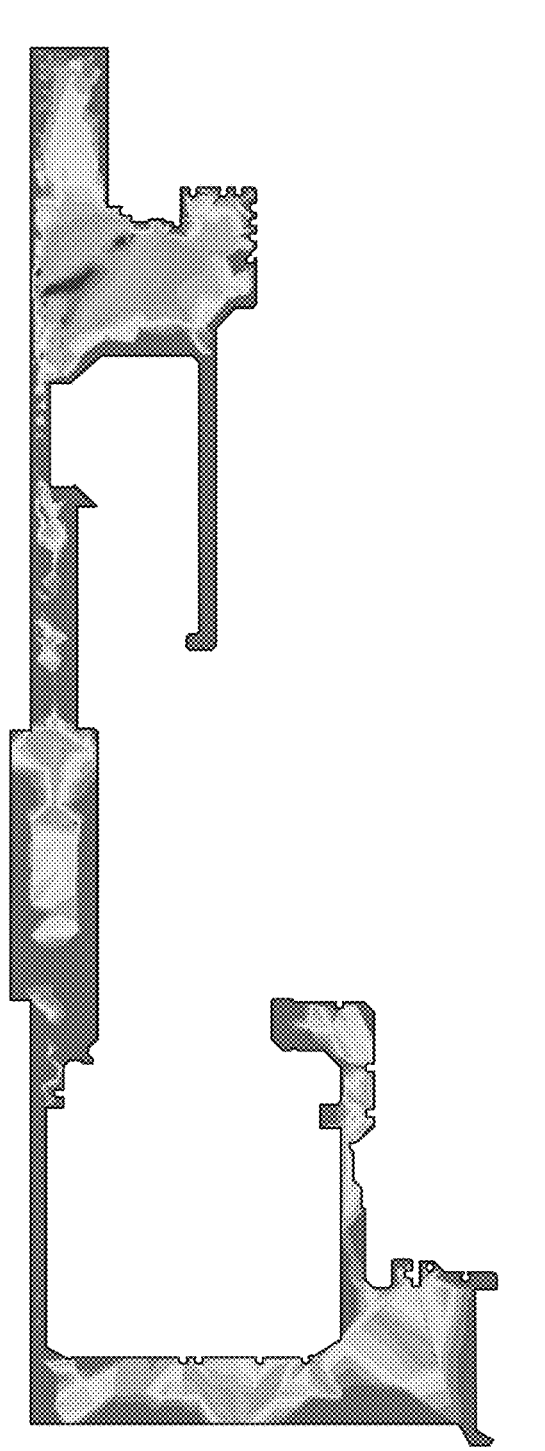
FIG. 5 depicts E-field intensity at the resonance frequency for a power plane that has been cut to 8 millimeters using a flat cut.

FIG. 4 depicts E-field intensity at a resonance frequency (3.6 GHz) for a power plane that has been cut into triangular patterns at a depth of 8 millimeters according to some aspects. FIG. 5 depicts E-field intensity at the resonance frequency for a power plane that has been cut to 8 millimeters using a flat cut. Because cut depths are similar, surface area of the metal plane is also similar. By comparing FIG. 4 and FIG. 5 it will be appreciated that E-field suppression is not due to reduction in surface area of the metal plane (e.g., power plane). Instead, E-field intensity is suppressed by the triangular-edge in FIG. 4 due to impedance discontinuity.

Figure 6:
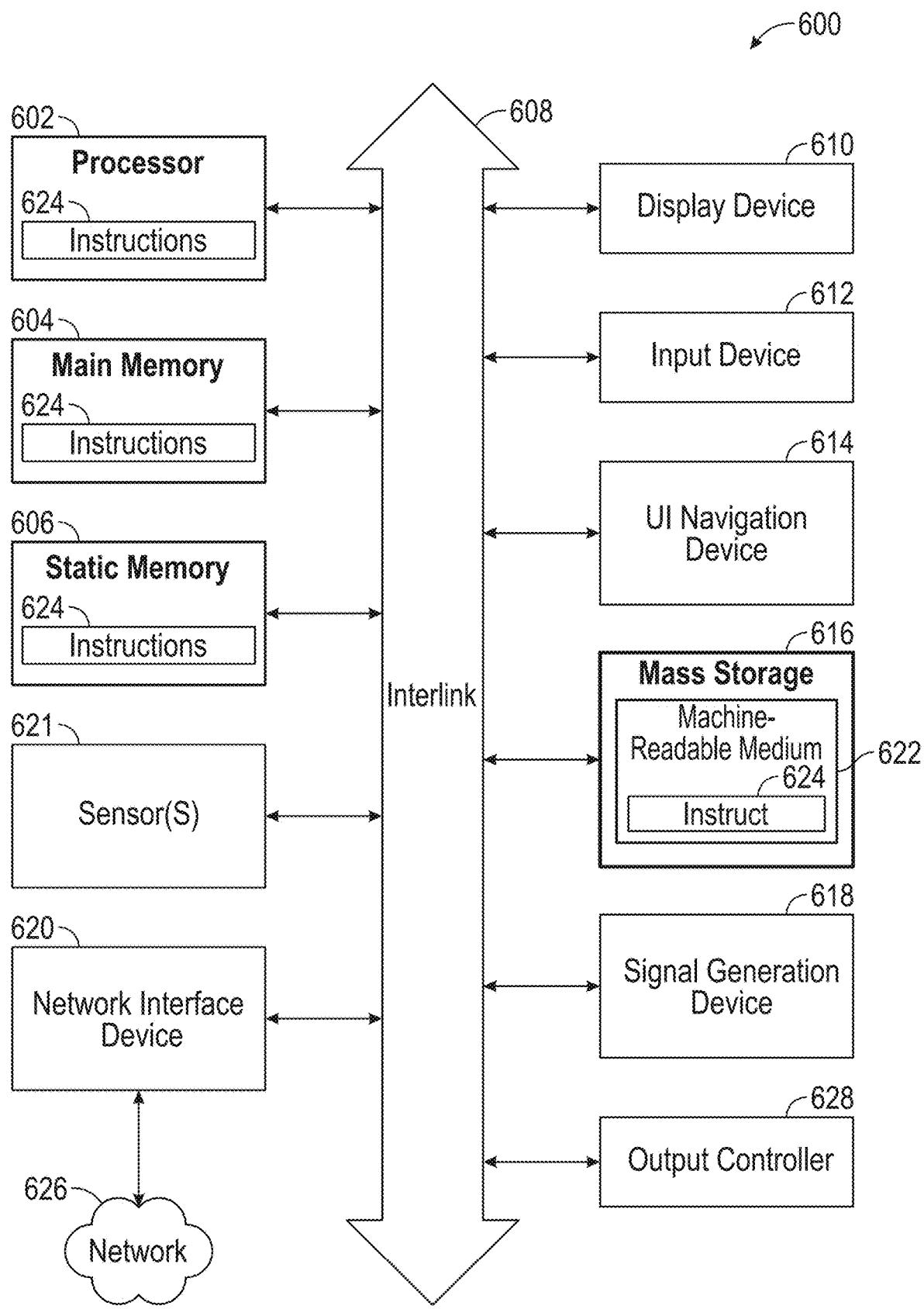
FIG. 6 illustrates a block diagram of an example machine that incorporates the printed circuit board described therein.

FIG. 6 illustrates a block diagram of an example machine 600 that incorporates the printed circuit board described herein. In some examples, portions of the example machine 600 can include one or more circuit boards cut using methods described herein. In alternative aspects, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (or other distributed) network environment. As used herein, peer-to-peer refers to a data link directly between two devices (e.g., it is not a hub-and spoke topology). Accordingly, peer-to-peer networking is networking to a set of machines using peer-to-peer data links. The machine 600 may be a single-board computer, an integrated circuit package, a system-on-a-chip (SOC), personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Machine (e.g., computer system) 600 may include a hardware processor 602 (e.g., a central processing unit (CPU), a graphics processing unit (GPU), a hardware processor core, or any combination thereof), a main memory 604 and a static memory 606, some or all of which may communicate with each other via an interlink (e.g., bus) 608. The machine 600 may further include a display unit 610, an alphanumeric input device 612 (e.g., a keyboard), and a user interface (UI) navigation device 614 (e.g., a mouse). In an example, the display unit 610, input device 612 and UI navigation device 614 may be a touch screen display. The machine 600 may additionally include a storage device (e.g., drive unit) 616, a signal generation device 618 (e.g., a speaker), a network interface device 620, and one or more sensors 621, such as a global positioning system (GPS) sensor, compass, accelerometer, or other sensor. The machine 600 may include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 616 may include a machine readable medium 622 on which is stored one or more sets of data structures or instructions 624 (e.g., software) embodying or utilized by any one or more of the techniques or functions described herein.

The instructions 624 may also reside, completely or at least partially, within the main memory 604, within static memory 606; or within the hardware processor 602 during execution thereof by the machine 600. In an example, one or any combination of the hardware processor 602, the main memory 604, the static memory 606, or the storage device 616 may constitute machine readable media.

While the machine readable medium 622 is illustrated as a single medium, the term "machine readable medium" may include a single medium or multiple media (e.g., a centralized or distributed database, and/or associated caches and servers) configured to store the one or more instructions 624.

The term "machine readable medium" may include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g.; Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 may further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., institute of Electrical and Electronics Engineers (IEEE) 802.11 family of standards known as Wi-Fi®, IEEE 802.16 family of standards known as WiMAX®), II-EE 802.15.4 family of standards, peer-to-peer networks, among others. In an example, the network interface device 720 may include one or more physical jacks (e.g., Ethernet, coaxial, or phone jacks) or one or more antennas to connect to the communications network 626. In an example, the network interface device 620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

ADDITIONAL EXAMPLES AND NOTES

In Example 1, a method of controlling impedance at an edge of a circuit board can include creating a cut at an edge of a plane of the circuit hoard, the cut extending from the edge of the plane to a point at a depth into the plane; and creating a cut pattern in the edge of the plane by creating a plurality of the cuts along the edge of the plane such that an impedance of the plane at the depth is different than an impedance of the plane at the edge of the plane.

In Example 2, the subject matter of Example 1 can optionally include wherein creating the cut pattern includes orienting angles of a plurality of cuts such that the cut pattern includes shapes with non-parallel sides.

In Example 3, the subject matter of any of Examples 1-2 can optionally include wherein the shapes within the cut pattern include triangular shapes.

In Example 4, the subject matter of any of Examples 1-2 can optionally include wherein the shapes within the cut pattern include semi-circular shapes.

In Example 5, the subject matter of any of Examples 1-4 can optionally include wherein a cut of the cut pattern extends 0.4-0.8 millimeters into the plane.

In Example 6, the subject matter of any of Examples 1-5 can optionally include wherein each cut extends the same distance into the plane.

In Example 7, the subject matter of any of Examples 1-5 can optionally include wherein cuts extend different distances into the plane.

In Example 8, the subject matter of any of Examples 1-7 can optionally include wherein each shape in the cut pattern is the same as every other shape in the cut pattern.

In Example 9, the subject matter of any of Examples 1-7 can optionally include wherein the cutting is performed at a power plane of the circuit board.

In Example 10, the subject matter of any of Examples 1-9 can optionally include wherein the cutting is performed at a plurality of planes of the circuit board.

In Example 11, the subject matter of Example 10 can optionally include wherein cutting is performed at a ground plane and at least one power plane.

In Example 12, the subject matter of Example 10 can optionally include wherein the cutting is performed at a plurality of power planes.

In Example 13, an apparatus or device (e.g., a circuit board or a printed circuit board (PCB)) can include a metal plane having an edge, wherein a cut pattern is created at the edge of the metal plane, the cut pattern created by making a plurality of cuts that that extend from the edge of the plane to a point at a depth into the plane, the plane having a gradual impedance change such that an impedance of the plane at the depth is different from an impedance of the plane at the edge of the plane.

In Example 14, the subject matter of Example 13 can optionally include wherein the cuts are oriented such that the cut pattern includes shapes with non-parallel sides.

In Example 15, the subject matter of any of Examples 13-14 can optionally include wherein the shapes within the cut pattern include triangular shapes.

In Example 16, the subject matter of any of Examples 13-14 can optionally include wherein the shapes within the cut pattern include semi-circular shapes.

In Example 17, the subject matter of any of Examples 13-16 can optionally include wherein a cut of the cut pattern extends 0.4-0.8 millimeters into the plane.

In Example 18, the subject matter of any of Examples 13-16 can optionally include wherein each cut extends the same distance into the plane.

In Example 19, the subject matter of any of Examples 13-18 can optionally include wherein the metal plane is a power plane.

In Example 20, the subject matter of any of Examples 13-19 can optionally include a ground plane, and wherein the cut pattern is additionally included in the ground plane.

Example 21 is a system (e.g., computing device, communication device, mobile apparatus, user equipment, base station, etc.) comprising a plurality of antennas and a circuit board comprising a metal plane having an edge, wherein a cut pattern is created at the edge of the metal plane, the cut pattern created by making a plurality of cuts that that extend from the edge of the plane to a point at a depth into the plane, the plane having a gradual impedance change such that an impedance of the plane at the depth is different from an impedance of the plane at the edge of the plane.

In Example 22, the subject matter of Example 21 can optionally include wherein the cuts are oriented such that the cut pattern includes shapes with non-parallel sides.

In Example 23, the subject matter of Example 21 can optionally include wherein a cut of the cut pattern extends 0.4-0.8 millimeters into the plane.

In Example 24, the subject matter of Example 21 can optionally include wherein the metal plane is a power plane.

Each of these non-limiting examples can stand on its own, or can be combined with one or more of the other examples in any permutation or combination.

The above detailed description includes references to the accompanying drawings, which form a part of the detailed description. The drawings show, by way of illustration, specific aspects in which the invention can be practiced. These aspects are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other aspects can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed aspect. Thus, the following claims are hereby incorporated into the Detailed Description, with each claim standing on its own as a separate aspect, and it is contemplated that such aspects can be combined with each other in various combinations or pei mutations. The scope of the invention should be determined with reference to the appended claims, along with the full scope of equivalents to which such claims are legally entitled.

What is claimed is:

1. A method of controlling impedance at an edge of a circuit board to reduce radio-frequency (RF) emissions by the circuit board, the circuit board for use in a wireless communication device comprising an antenna, the circuit board having a power plane and a ground plane, the method comprising:
    creating a plurality of cuts at an edge of a the power plane of the circuit board, each cut extending from the edge of the power plane to a point at a depth into the power plane; and
    creating a cut pattern in one segment of the edge of the power plane by creating the plurality of the cuts along the edge of the power plane such that an impedance of the plane at the depth a each cut is different than an impedance of the power plane at the edge of the power plane, wherein at least a portion of the edge of the power plane includes no cuts,
    wherein shapes within the cut pattern comprise triangular shapes and semi-circular shapes, and
    wherein the cut pattern, including the points and the depths of the cuts and including the portion of the edge without cuts, is selected to suppress E-field intensity at one or more resonance frequencies of the power plane to reduce the RF emissions of the circuit board to reduce interference with the antenna.

2. The method of claim 1, wherein creating the cut pattern includes orienting angles of the plurality of cuts such that the cut pattern includes shapes with non-parallel sides.

3. The method of claim 1, wherein a cut of the cut pattern extends 0.4-0.8 millimeters into the plane.

4. The method of claim 3, wherein cuts extend different distances into the plane.

5. The method of claim 1, wherein the circuit board comprises a plurality of planes, including the power plane, and wherein creating the cut pattern is performed at the plurality of planes of the circuit board.

6. The method of claim 5, wherein the plurality of planes includes a ground plane, and wherein the creating the cut pattern is performed at a ground plane and at least one power plane.

7. The method of claim 5, wherein the plurality of planes includes a plurality of power planes, and wherein the creating the cut pattern is performed at a plurality of power planes.

* * * * *

UNITED STATES PATENT AND TRADEMARK OFFICE
CERTIFICATE OF CORRECTION

PATENT NO. : 11,277,903 B2
APPLICATION NO. : 16/368221
DATED : March 15, 2022
INVENTOR(S) : Hall et al.

It is certified that error appears in the above-identified patent and that said Letters Patent is hereby corrected as shown below:

In the Claims

In Column 8, Line 35, in Claim 1, delete "a" and insert --of-- therefor

Signed and Sealed this
Twenty-fourth Day of May, 2022

Katherine Kelly Vidal
*Director of the United States Patent and Trademark Office*